US010404081B2

(12) United States Patent
Ota et al.

(10) Patent No.: US 10,404,081 B2
(45) Date of Patent: Sep. 3, 2019

(54) BATTERY STATE DETECTOR

(71) Applicant: Yazaki Corporation, Tokyo (JP)

(72) Inventors: Takao Ota, Shizuoka (JP); Kazuya Harakawa, Shizuoka (JP); Takao Shoji, Shizuoka (JP); Shinichi Yanagihara, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/712,350

(22) Filed: Sep. 22, 2017

(65) Prior Publication Data

US 2018/0090952 A1 Mar. 29, 2018

(30) Foreign Application Priority Data

Sep. 26, 2016 (JP) .................. 2016-187341

(51) Int. Cl.
| | | |
|---|---|---|
| *H02J 7/00* | (2006.01) | |
| *H01M 10/48* | (2006.01) | |
| *G01R 31/396* | (2019.01) | |
| *H04Q 9/00* | (2006.01) | |
| *H01M 10/42* | (2006.01) | |
| *H02J 13/00* | (2006.01) | |
| *G01R 31/382* | (2019.01) | |
| *H01M 2/20* | (2006.01) | |

(52) U.S. Cl.
CPC ......... *H02J 7/0029* (2013.01); *H01M 10/425* (2013.01); *H01M 10/482* (2013.01); *H02J 7/0021* (2013.01); *H02J 13/0003* (2013.01); *H04Q 9/00* (2013.01); *G01R 31/382* (2019.01); *G01R 31/396* (2019.01); *H01M 2/206* (2013.01); *H01M 2010/4278* (2013.01); *H01M 2220/20* (2013.01); *H04Q 2209/30* (2013.01); *Y02T 10/7055* (2013.01)

(58) Field of Classification Search
CPC ....................................................... H02J 7/0029
USPC ............................................................ 320/134
See application file for complete search history.

(56) References Cited

U.S. PATENT DOCUMENTS 9,024,572 B2 5/2015 Nishihara et al.
9,461,342 B2 10/2016 Saigo et al.
(Continued)

FOREIGN PATENT DOCUMENTS

JP 2011-119235 A 6/2011
JP 2013-005509 A 1/2013
(Continued)

OTHER PUBLICATIONS

Communication dated May 21, 2019 in counterpart JP Application No. 2016-187341.

*Primary Examiner* — Jerry D Robbins
(74) *Attorney, Agent, or Firm* — Sughrue Mion, PLLC

(57) ABSTRACT

A battery state detector includes a main unit configured to detect a state of one battery assembly in a battery pack storing therein a plurality of battery assemblies each including a plurality of battery cells arranged in rows, a subunit configured to detect a state of a battery assembly in the battery pack other than the battery assembly that is a detection target of the main unit, and a first communication line that connects the main unit with the subunit. The main unit is connected to a controller configured to control the battery pack via a second communication line that is separate from the first communication line.

5 Claims, 6 Drawing Sheets

(56) References Cited

U.S. PATENT DOCUMENTS

| | | | |
|---|---|---|---|
| 2011/0101920 A1* | 5/2011 | Seo | B60L 11/1861 320/127 |
| 2012/0019061 A1 | 1/2012 | Nishihara et al. | |
| 2012/0032351 A1 | 2/2012 | Kao et al. | |
| 2014/0141301 A1* | 5/2014 | Aoki | H01M 10/482 429/90 |
| 2014/0368040 A1 | 12/2014 | Chen et al. | |

FOREIGN PATENT DOCUMENTS

| JP | 5621765 B2 | 11/2014 |
|---|---|---|
| JP | 2015-133823 A | 7/2015 |

* cited by examiner

BATTERY STATE DETECTOR

CROSS-REFERENCE TO RELATED APPLICATION(S)

The present application claims priority to and incorporates by reference the entire contents of Japanese Patent Application No. 2016-187341 filed in Japan on Sep. 26, 2016.

BACKGROUND OF THE INVENTION

1. Field of the Invention

The present invention relates to a battery state detector.

2. Description of the Related Art

Technologies for detecting a state of batteries in a battery pack have been known. Japanese Patent No. 5621765 discloses a technology of a battery module that includes a battery block composed of a plurality of battery cells, a voltage detecting circuit (state detecting circuit) for detecting a voltage between terminals of each of the battery cells, and a flexible printed circuit board in which a voltage detecting line for electrically connecting a positive electrode terminal or a negative electrode terminal of each of the battery cells and the voltage detecting circuit (state detecting circuit) is integrated with a substrate made of a flexible material.

A battery state detector that detects a state of batteries is communicably connected to, for example, a controller such as a battery electronic control unit (ECU) that controls the battery pack. What is desired here is a simpler configuration of communication wiring for the battery state detector. A simpler configuration of the communication wiring can be achieved if no modification of the communication wiring is required that connects the battery state detector and the controller even when the number of batteries or the number of stacks in a battery pack varies, for example. It is desired to reduce the communication load of the controller.

SUMMARY OF THE INVENTION

It is an object of the present invention to provide a battery state detector that can achieve a simpler configuration of communication wiring. It is another object of the present invention to provide a battery state detector that can reduce communication load of a controller.

In order to achieve the above mentioned object, a battery state detector according to one aspect of the present invention includes a main unit configured to detect a state of one battery assembly in a battery pack storing therein a plurality of battery assemblies each including a plurality of battery cells arranged in rows; a subunit configured to detect a state of a battery assembly in the battery pack other than the battery assembly that is a detection target of the main unit; and a first communication line that connects the main unit with the subunit, wherein the main unit is connected to a controller configured to control the battery pack via a second communication line that is separate from the first communication line.

According to another aspect of the present invention, in the battery state detector, it is preferable that the main unit receives a detection result of the subunit from the subunit via the first communication line, and the main unit transmits management information based on the detection result of the subunit and a detection result of the main unit to the controller via the second communication line.

According to still another aspect of the present invention, in the battery state detector, it is preferable that the main unit is integrated with a busbar module that electrically connects the battery cells in the battery assembly, a state of the battery assembly being detected by the main unit, and the subunit is integrated with a busbar module that electrically connects the battery cells in the battery assembly, a state of the battery assembly being detected by the subunit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

The following describes in detail a battery state detector according to an embodiment of the present invention with reference to the accompanying drawings. The embodiment is not intended to limit the scope of the present invention. Components in the following embodiment include components that can be easily thought of by those skilled in the art or components that are substantially the same.

Embodiment

Figure 1:
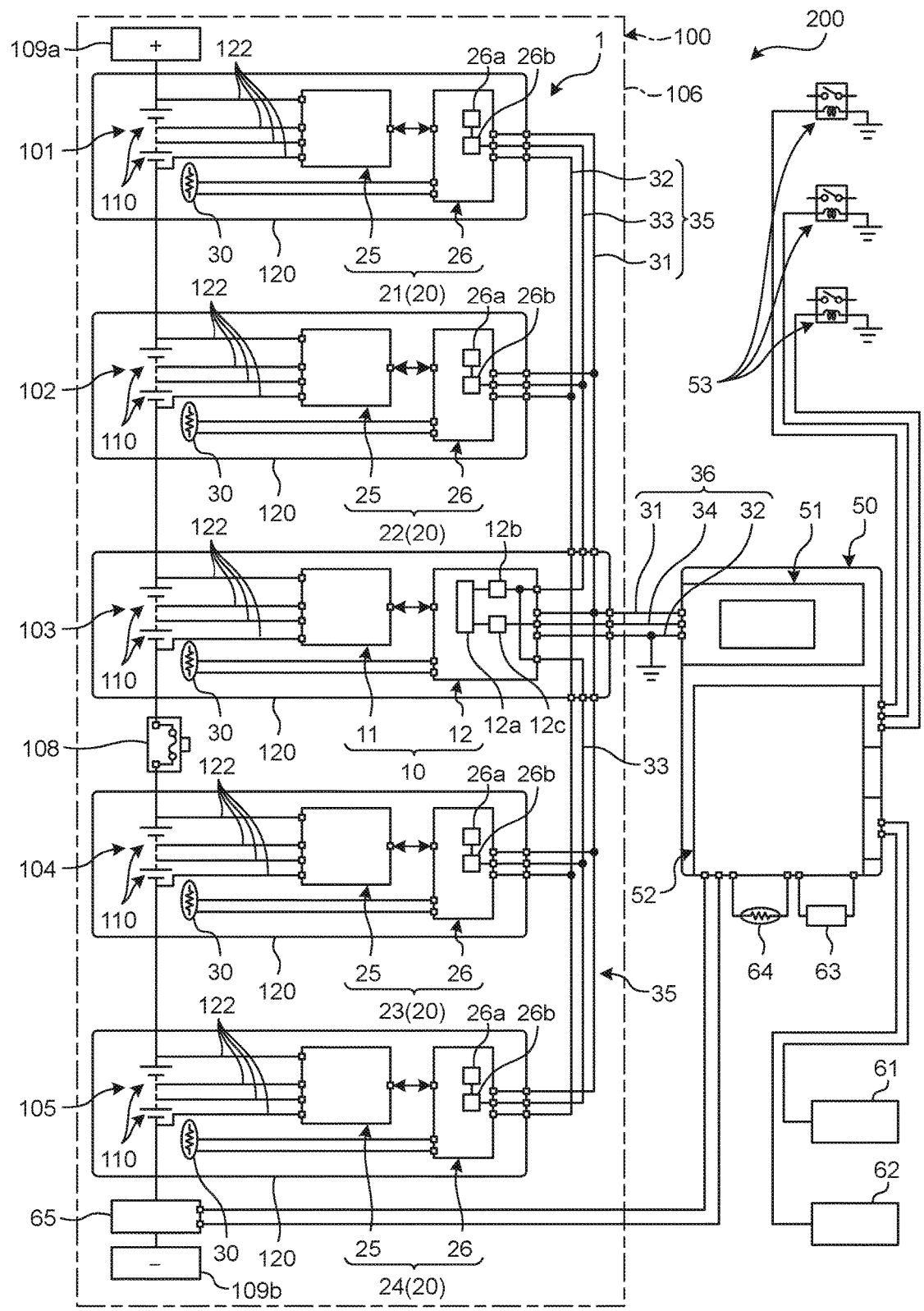
FIG. 1 is a diagram illustrating an example of a circuit configuration of a battery state detector according to an embodiment of the present invention.
Figure 2:
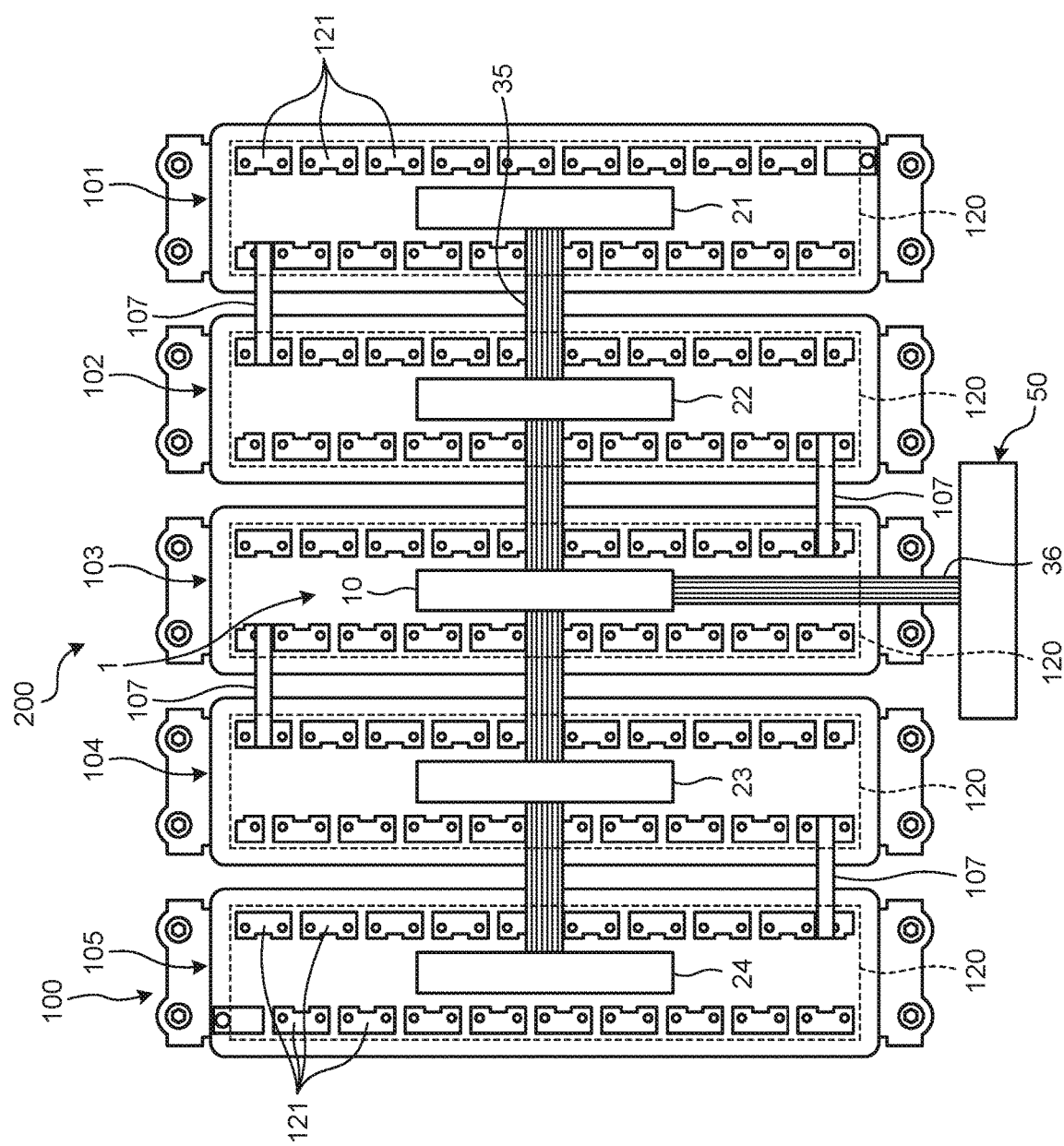
FIG. 2 is a plan view illustrating a schematic configuration of the battery state detector according to the embodiment.
Figure 3:
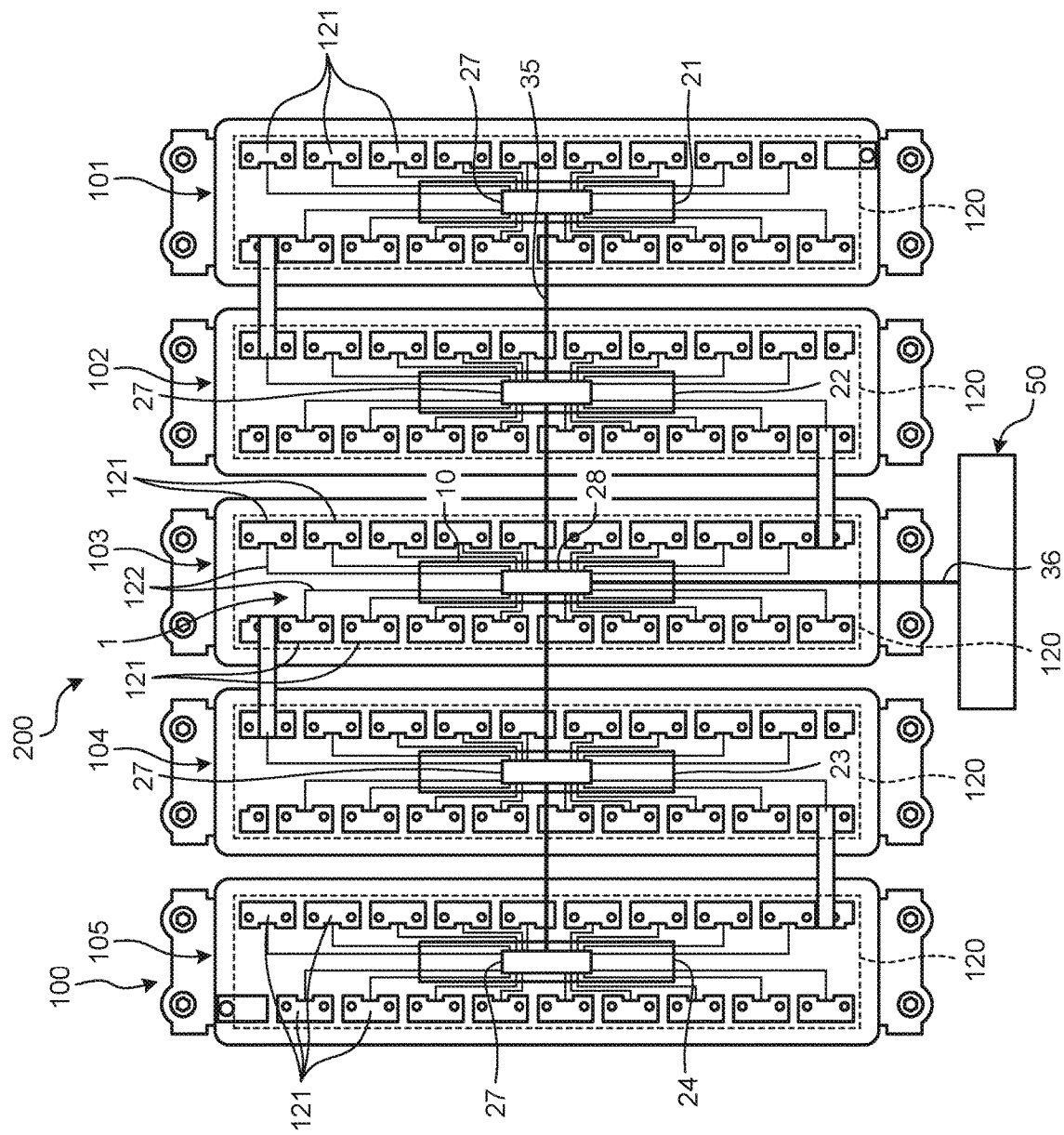
FIG. 3 is a plan view illustrating an example of a specific configuration of the battery state detector according to the embodiment.

The embodiment will be described with reference to FIGS. 1 to 4. The present embodiment relates to a battery state detector and a battery controller. FIG. 1 is a diagram illustrating an example of a circuit configuration of the battery state detector according to the embodiment, FIG. 2 is a plan view illustrating a schematic configuration of the battery state detector according to the embodiment, and FIG. 3 is a plan view illustrating an example of a specific configuration of the battery state detector according to the embodiment.

As illustrated in FIG. 1, this battery state detector 1 according to the embodiment is disposed in a battery pack 100. The battery state detector 1 according to the present embodiment includes a main unit 10, subunits 20, and a first communication line 33. The battery state detector 1 may further include a second communication line 34. A battery controller 200 according to the present embodiment includes the battery state detector 1 and a battery ECU 50.

The battery pack 100 is installed in a vehicle such as an electric vehicle or a hybrid vehicle, as a power supply for traveling. The battery state detector 1 detects individual states of stacks 101, 102, 103, 104, and 105 in the battery pack 100. The battery state detector 1 transmits management information based on the results of the detection to the battery ECU 50. The battery ECU 50 is a controller for controlling the battery pack 100. The battery ECU 50 controls the battery pack 100 in accordance with the management information acquired from the battery state detector 1. Examples of the control performed by the battery ECU 50 on the battery pack 100 include notifying, for example, a person in the vehicle of abnormalities of the battery pack 100 and controlling peripherals of the battery pack 100, as well as controlling the operation of the battery pack 100.

The battery pack 100 includes a first stack 101, a second stack 102, a third stack 103, a fourth stack 104, a fifth stack 105, and a housing 106 that stores therein the stacks 101, 102, 103, 104, and 105. The stacks 101, 102, 103, 104, and 105 are battery assemblies each including a plurality of battery cells 110 arranged in rows. Each battery cell 110 is a secondary battery such as a lithium-ion battery. The battery cells 110 are arranged in rows to form a rectangular parallelepiped shape as a whole in the stacks 101, 102, 103, 104, and 105. The battery pack 100 are arranged such that the positive electrode of a battery cell 110 and the negative electrode of a next battery cell 110 are adjacent to each other.

The stacks 101, 102, 103, 104, and 105 are arranged in a plurality of rows in the housing 106. In other words, the stacks 101, 102, 103, 104, and 105 are disposed in the housing 106 in this order with a longitudinal side surface of a stack facing a longitudinal side surface of a next stack. Adjacent stacks are electrically connected. A service plug 108 is interposed between the third stack 103 and the fourth stack 104. The first stack 101 is connected to a terminal positive electrode 109a, and the fifth stack 105 is connected to a terminal negative electrode 109b.

As illustrated in FIGS. 1 and 2, busbar modules 120 are disposed on the stacks 101, 102, 103, 104, and 105. Each busbar module 120 electrically connects the battery cells 110. Specifically, each busbar module 120 includes a plurality of busbars 121. Each busbar 121 electrically connects electrodes of adjacent battery cells 110. The busbars 121 according to the present embodiment connect the battery cells 110 in series. In other words, the busbars 121 connect the positive electrode of a battery cell 110 with the negative electrode of an adjacent battery cell 110. Each busbar module 120 includes a circuit body connected to the busbars 121. The circuit body is configured by, for example, a printed circuit body or a flexible printed circuit (FPC). This configuration allows the battery pack 100 to have a shorter height and a lighter weight. The circuit body includes, for example, voltage detection lines 122 and a thermistor 30.

The circuit body of the main unit 10 to be described later includes, as illustrated in FIG. 1, a high-voltage circuit 11 and a low-voltage circuit 12, and the circuit body of the subunits 20 includes a high-voltage circuit 25 and a low-voltage circuit 26. As illustrated in FIG. 2, the stacks 101, 102, 103, 104, and 105 are electrically connected by connecting members 107. In the battery pack 100 according to the present embodiment, the five stacks 101, 102, 103, 104, and 105 are connected in series by the connecting members 107.

The main unit 10 detects a state of a stack out of the stacks 101, 102, 103, 104, and 105 arranged in a plurality of rows. The main unit 10 according to the present embodiment detects the state of the third stack 103 located in the center of the stacks. The main unit 10 is integrated with the busbar module 120 of the third stack 103. Electronic parts that configure the main unit 10 are mounted on the busbar module 120 of the third stack 103 and the electronic parts constitute the electric circuit of the main unit 10.

The main unit 10 includes the high-voltage circuit 11 and the low-voltage circuit 12. The high-voltage circuit 11 detects voltages of the battery cells 110 of the third stack 103. More specifically, a plurality of voltage detection lines 122 are connected to the high-voltage circuit 11. As illustrated in FIG. 3, the voltage detection lines 122 are connected to the corresponding busbars 121. The high-voltage circuit 11 is electrically connected to the positive electrodes and the negative electrodes of the battery cells 110 via the voltage detection lines 122 and the busbars 121. The high-voltage circuit 11 includes a voltage detector that detects the voltages of the battery cells 110. The high-voltage circuit 11 detects cell voltages that are the voltages of the battery cells 110. The high-voltage circuit 11 can calculate a sum of the detected cell voltages and perform equalization processing on the cell voltages.

As illustrated in FIG. 1, the low-voltage circuit 12 includes a calculator 12a, a first communication interface 12b, and a second communication interface 12c. The calculator 12a performs various types of calculations. The thermistor 30 is connected to the low-voltage circuit 12. The thermistor 30 outputs signals in accordance with the temperatures of the battery cells 110 of the third stack 103. The calculator 12a detects the temperatures of the battery cells 110 of the third stack 103 based on the signals acquired from the thermistor 30. The low-voltage circuit 12 is communicably connected to the high-voltage circuit 11. The calculator 12a determines whether an abnormality occurs in the third stack 103 on the basis of the cell voltages or the sum of the cell voltages acquired from the high-voltage circuit 11 by communication.

The first communication line 33 is connected to the first communication interface 12b. The calculator 12a is communicably connected to the low-voltage circuits 26 of the subunits 20 via the first communication interface 12b and the first communication line 33. The second communication line 34 is connected to the second communication interface 12c. The calculator 12a communicates with the battery ECU 50 via the second communication interface 12c and the second communication line 34. Communication protocols used in the communication via the first communication line 33 and the second communication line 34 are not limited to any particular protocol. The communication protocol for the communication via the first communication line 33 may be the same as or different from the communication protocol for the communication via the second communication line 34.

The subunits 20 are provided to the first stack 101, the second stack 102, the fourth stack 104, and the fifth stack 105 that are the stacks other than the stack that is the detection target of the main unit 10. The subunits 20 of the stacks 101, 102, 104 and 105 have the same configuration. In the present description, the subunit 20 that detects a state of the first stack 101 is referred to as a first subunit 21. In the same manner, the subunits 20 that detect a state of the second stack 102, the fourth stack 104, and the fifth stack 105 are referred to as a second subunit 22, a third subunit 23, and a fourth subunit 24, respectively.

The subunits 20 are described with reference to the first subunit 21 disposed in the first stack 101. The first subunit 21 detects a state of the first stack 101. The first subunit 21 is integrated with the busbar module 120 of the first stack 101. Electronic parts that configure the first subunit 21 are mounted on the busbar module 120 of the first stack 101 and the electronic parts constitute the electric circuit of the subunit 20.

The first subunit 21 includes the high-voltage circuit 25 and the low-voltage circuit 26. The high-voltage circuit 25 detects voltages of the battery cells 110 of the first stack 101 that is the detection target of the first subunit 21. A plurality of voltage detection lines 122 are connected to the high-voltage circuit 25. The high-voltage circuit 25 is electrically connected to the positive electrodes and the negative electrodes of the battery cells 110 via the voltage detection lines 122. The high-voltage circuit 25 includes a voltage detector that detects the voltages of the battery cells 110. The high-voltage circuit 25 can calculate a sum of the detected cell voltages and perform equalization processing on the cell voltages.

The low-voltage circuit 26 includes a calculator 26a and a communication interface 26b. The thermistor 30 disposed in the first stack 101 is connected to the low-voltage circuit 26. The calculator 26a detects the temperatures of the battery cells 110 of the first stack 101 based on the signals acquired from the thermistor 30. The low-voltage circuit 26 is communicably connected to the high-voltage circuit 25.

The first communication line 33 is connected to the communication interface 26b. The calculator 26a is communicably connected to the low-voltage circuit 12 of the main unit 10 via the communication interface 26b and the first communication line 33. The calculator 26a may communicate with the subunits 20 of the other stacks 102, 104, and 105 via the first communication line 33.

The calculator 26a of the first subunit 21 transmits information such as cell voltages or the sum of the cell voltages of the first stack 101 acquired from the high-voltage circuit 25 by communication and information such as battery temperatures thereof to the main unit 10. In the same manner, the second subunit 22, the third subunit 23, and the fourth subunit 24 transmit information such as cell voltages or the sum of the cell voltages and the battery temperatures of the second stack 102, the fourth stack 104, and the fifth stack 105 to the main unit 10.

The calculator 12a of the main unit 10 calculates management information on the basis of the detection results of the subunits 21, 22, 23 and 24 and the detection result of the main unit 10. The management information is used by the battery ECU 50 to control the battery pack 100. The management information includes, for example, results of determination as to whether the battery cells 110 of the stacks 101, 102, 103, 104, and 105 are in an abnormal state or a normal state. The management information includes thermal states of the battery cells 110. The management information includes results of failure determination on the stacks 101, 102, 103, 104, and 105. The calculator 12a transmits the management information to the battery ECU 50.

The battery ECU 50 includes a communication interface 51 and a calculator 52. The second communication line 34 is connected to the communication interface 51. The calculator 52 communicates with the main unit 10 via the communication interface 51 and the second communication line 34. The calculator 52 acquires the management information from the main unit 10 by communication.

The battery ECU 50 is communicably connected to an inverter 61 and an airbag ECU 62. The inverter 61 is interposed between, for example, the battery pack 100 and the motor of the vehicle. The inverter 61 can convert direct current power output from the battery pack 100 into alternating current power and supply the alternating current power to the motor, and can convert alternating current power from the motor into direct current power and supply the direct current power to the battery pack 100. The battery ECU 50 communicates with the inverter 61 in accordance with an instruction transmitted from, for example, a vehicle control ECU installed in the vehicle. More specifically, the inverter 61 includes an inverter ECU that controls the inverter 61. The inverter ECU causes the inverter 61 to operate in accordance with an instruction from the battery ECU 50. The calculator 52 transmits a state of the battery pack 100, that is, for example, information as to whether the battery pack 100 operates normally, to the airbag ECU 62.

The battery ECU 50 is connected to a blower motor 63, an inlet-air temperature sensor 64, and a current sensor 65. The blower motor 63 is a motor that sends cooling air to the battery pack 100. The inlet-air temperature sensor 64 is a sensor that detects an inlet-air temperature of the blower motor 63. The current sensor 65 is a sensor that detects input current and output current to and from the battery pack 100. The calculator 52 controls the blower motor 63 in accordance with the detection result of the inlet-air temperature sensor 64 and the thermal states of the battery cells 110 acquired from the main unit 10. The calculator 52 calculates remaining charge of the battery pack 100 based on the detection result of the current sensor 65.

The battery ECU 50 is connected to relays 53. The relays 53 connect the battery pack 100 with components in the vehicle and disconnect the battery pack 100 therefrom. The relays 53 are installed in, for example, an electrical connection box connected to the battery pack 100. The relays 53 are disposed, for example, between the battery pack 100 and the inverter 61 and between the battery pack 100 and a transformer. The battery ECU 50 can disconnect the battery pack 100 by opening the relays 53.

A power line 31 and a ground line 32 are connected to the main unit 10, the subunits 20, and the battery ECU 50. The main unit 10, the subunits 20, and the battery ECU 50 are operated by power supplied from the common power line 31. The main unit 10, the subunits 20, and the battery ECU 50 are grounded via the common ground line 32. In the present embodiment, the main unit 10 and the subunits 20 are connected via a first cable 35. The first cable 35 includes the power line 31, the ground line 32, and the first communication line 33. The first cable 35 is configured by, for example, a flexible flat cable (FFC). The main unit 10 and the battery ECU 50 are connected via a second cable 36. The second cable 36 includes the power line 31, the ground line 32, and the second communication line 34. The second cable 36 is configured by, for example, an FFC.

Figure 4:
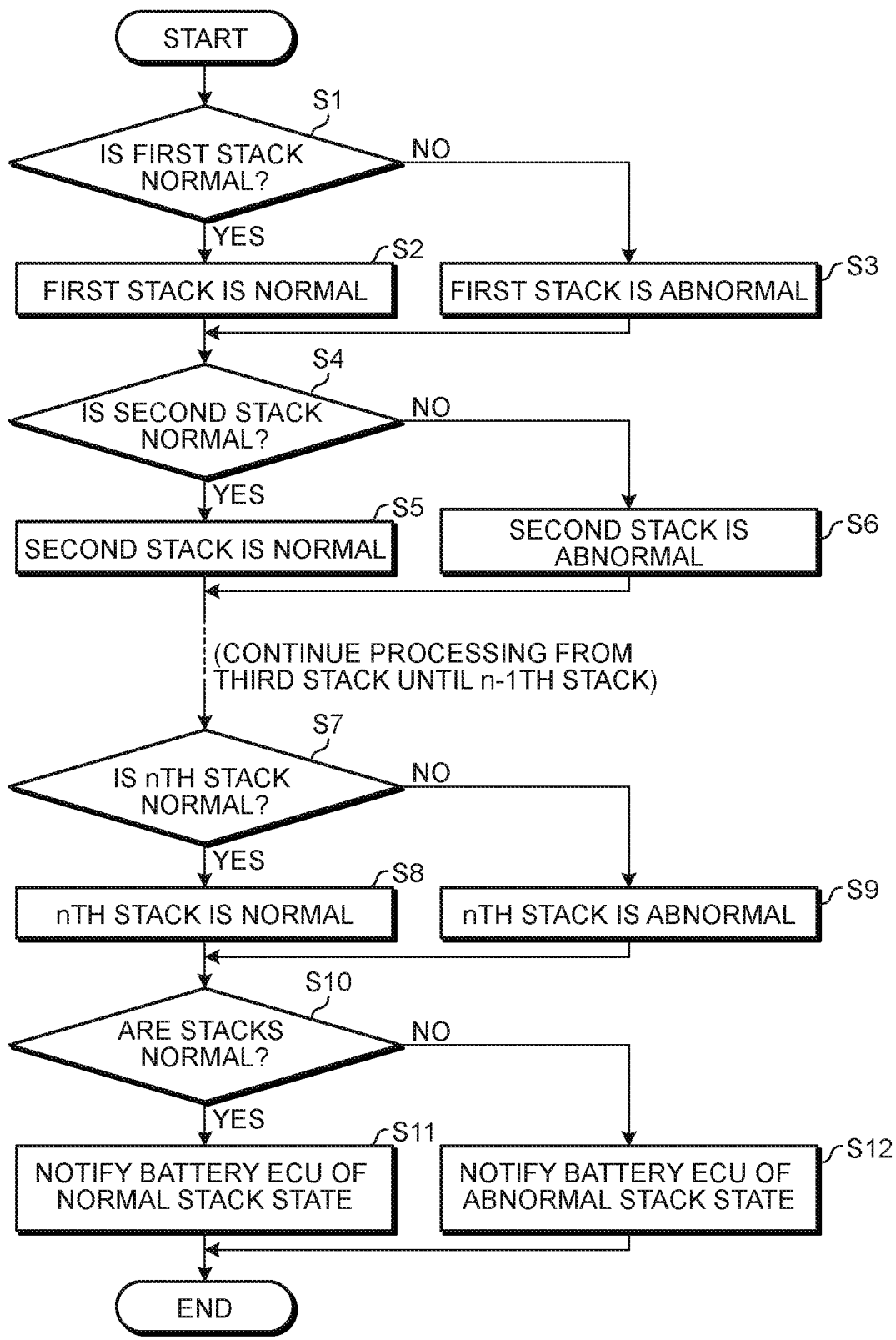
FIG. 4 is a flowchart illustrating an operation of the battery state detector according to the embodiment.

The operation of the battery state detector 1 according to the present embodiment is described with reference to FIG. 4. The control procedure illustrated in FIG. 4 is performed in, for example, an ignition-on state and is performed repeatedly.

At Step S1, the main unit 10 determines whether the first stack 101 is in a normal state. The calculator 12a of the main unit 10 performs determination at Step S1 based on the detection result of the cell voltages of the battery cells 110 in the first stack 101. If, for example, all the values of the cell voltages of the battery cells 110 are within a normal range, the calculator 12a determines that the first stack 101 is in a normal state. If there is a battery cell 110 having a value of the cell voltage out of the normal range, the calculator 12a determines that the first stack 101 is not in a normal state. If the first stack 101 is determined to be normal at Step S1 (Yes at Step S1), the process proceeds to Step S2. If not (No at Step S1), the process proceeds to Step S3.

At Step S2, the calculator 12a of the main unit 10 registers the determination that the first stack 101 is in a normal state. The calculator 12a, for example, turns off a flag indicating that the first stack 101 is in an abnormal state. After Step S2, the process proceeds to Step S4.

At Step S3, the calculator 12a of the main unit 10 registers the determination that the first stack 101 is in an abnormal state. The calculator 12a, for example, turns on the flag indicating that the first stack 101 is in an abnormal state. After Step S3, the process proceeds to Step S4.

At Step S4, the main unit 10 determines whether the second stack 102 is in a normal state. The determination at Step S4 is performed in the same manner at Step S1. If a positive determination is made at Step S4 (Yes at Step S4), the process proceeds to Step S5. If not (No at Step S4), the process proceeds to Step S6.

At Step S5, the main unit 10 registers the determination that the second stack 102 is in a normal state. At Step S6, the main unit 10 registers the determination that the second stack 102 is in an abnormal state. For example, a flag indicating abnormality of the second stack 102 is switched between on and off upon registration at Steps S6 and S5, respectively.

The main unit 10 performs the determination and registration process from Step S1 to Step S6 with respect to the stacks 103 and 104 in the same manner. Suppose that the total number of stacks is n, the main unit 10 performs the state determination and registration process with respect to the third stack 103 to the (n−1)th stack. After the determination and registration process on the (n−1)th stack, the process proceeds to Step S7.

At Step S7, the main unit 10 determines the state of the nth stack. In the present embodiment, the total number n of stacks is five, and the state of the fifth stack 105 is determined at Step S7. If the fifth stack 105 is determined to be normal at Step S7 (Yes at Step S7), the process proceeds to Step S8. If not (No at Step S7), the process proceeds to Step S9.

At Step S8, the main unit 10 registers the determination that the fifth stack 105 is in a normal state. After Step S8, the process proceeds to Step S10.

At Step S9, the main unit 10 registers the determination that the fifth stack 105 is in an abnormal state. After Step S9, the process proceeds to Step S10.

At Step S10, the main unit 10 determines whether the stacks 101, 102, 103, 104, and 105 are in a normal state. If the registrations indicate that all the stacks 101, 102, 103, 104, and 105 are in a normal state, the calculator 12a of the main unit 10 makes a positive determination at Step S10. If there is a stack registered as abnormal, the calculator 12a makes a negative determination at Step S10. If a positive determination is made at Step S10 (Yes at Step S10), the process proceeds to Step S11. If a negative determination is made (No at Step S10), the process proceeds to Step S12.

At Step S11, the calculator 12a of the main unit 10 notifies the battery ECU 50 of the normal state of the stacks. The calculator 12a transmits a signal indicating that the stacks 101, 102, 103, 104, and 105 are in a normal state to the battery ECU 50 via the second communication line 34. After Step S11, the control procedure at this time is ended.

At Step S12, the main unit 10 notifies the battery ECU 50 of the abnormal state of the stacks. The main unit 10 transmits a signal indicating that at least one of the stacks 101, 102, 103, 104, and 105 is in an abnormal state to the battery ECU 50 via the second communication line 34. The main unit 10 can transmit a signal specifically indicating which stack is in an abnormal state. After Step S12, the control procedure at this time is ended.

When the battery ECU 50 is notified of an abnormal state of the stacks by the main unit 10, the battery ECU 50 executes a process for an abnormal situation. The process for an abnormal situation includes, for example, an operation of notifying the vehicle control ECU of the abnormal state of the stacks. The process for an abnormal situation includes an operation of notifying the driver of the vehicle of the abnormal state of the stacks. The driver is notified of the abnormal state with the illumination of a warning light or an alarm sound. The battery ECU 50 may disconnect the battery pack 100 by opening the relays 53. When, for example, a plurality of battery packs 100 are installed in a vehicle, the battery ECU 50 can disconnect a battery pack 100 including a stack in an abnormal state while maintaining power supply from the other battery packs 100.

As described above, the battery state detector 1 according to the present embodiment includes the main unit 10, the subunits 20, and the first communication line 33. The main unit 10 detects a state of the stack 103 in the battery pack 100 that stores therein the stacks 101, 102, 103, 104, and 105 each including a plurality of battery cells 110 arranged in rows. The subunits 20 detect states of the stacks 101, 102, 104, and 105 in the battery pack 100 other than the stack that is the detection target of the main unit 10. The first communication line 33 connects the main unit 10 with the subunits 20.

The main unit 10 is connected to the battery ECU 50 that controls the battery pack 100 via the second communication line 34 that is separate from the first communication line 33. In the battery state detector 1 according to the present embodiment, the first communication line 33 that connects the main unit 10 with the subunits 20 is separate from the second communication line 34 that connects the main unit 10 with the battery ECU 50. In other words, the communication path between the main unit 10 and the subunits 20 is independent of the communication path between the main unit 10 and the battery ECU 50. This separate configuration achieves a simpler configuration of communication wiring. For example, this configuration can reduce the total length of the communication lines or reduce the number of communication lines compared to a case in which the battery ECU 50 is connected to all the units 10, 21, 22, 23, and 24 via individual communication lines. In addition, this configuration can eliminate the need for modifying the second communication line 34 even when the number of battery cells 110 or the number of stacks in the battery pack 100 varies, thereby achieving a simpler configuration of communication wiring.

The configuration of the battery state detector 1 according to the present embodiment can reduce the communication load of the battery ECU 50. For example, this configuration can significantly reduce the amount of data received by the battery ECU 50 compared to a case in which the battery ECU 50 is communicably connected to all the units 10, 21, 22, 23, and 24. This results in a reduction of the calculation load of the battery ECU 50.

The configuration of the battery state detector 1 according to the present embodiment allows greater flexibility in modifying the configuration of the battery pack 100. For example, a larger number of stacks may be needed in the battery pack 100 to increase the capacity of the battery pack 100. In this case, the battery state detector 1 according to the present embodiment can deal with the increase in the number of stacks by modifying only the first communication line 33 without modifying the second communication line 34.

In the battery state detector 1 according to the present embodiment, the main unit 10 receives detection results of the subunits 20 from the subunits 20 via the first communication line 33. The main unit 10 transmits the management information based on the detection results of the subunits 20 and the detection result of the main unit 10 to the battery ECU 50 via the second communication line 34. The main unit 10 centrally controls the stacks 101, 102, 103, 104, and 105, which achieves an efficient management of the operation of the battery pack 100. This configuration eliminates the need for monitoring the individual battery cells 110 by the battery ECU 50, thereby reducing the monitoring load of the battery ECU 50.

The first communication line 33 is used for communication for monitoring the states of the stacks 101, 102, 103, 104, and 105, whereas the second communication line 34 is used for communicating management information based on the monitoring results. This configuration can reduce communication traffic in the second communication line 34, thereby reducing the communication load of the battery ECU 50.

The battery ECU 50 does not need to monitor the individual battery cells 110 or the individual stacks 101, 102, 103, 104, and 105. This configuration allows variation in the number of battery cells 110 or stacks 101, 102, 103, 104, and 105 without changing software in the battery ECU 50. In other words, integrating monitoring functions of the battery pack 100 in the main unit 10 can increase versatility and expandability of the battery ECU 50. Even when the number of battery cells 110 or the number of stacks increases, the processing load of the battery ECU 50 does not increase significantly.

The main unit 10 according to the present embodiment is integrated with the busbar module 120 that electrically connects the battery cells 110 of the third stack 103. The subunits 20 according to the present embodiment are integrated with the busbar modules 120 that electrically connect the battery cells 110 of the stacks 101, 102, 104, and 105, the states of the stacks being detected by the corresponding subunits 20. For example, the first subunit 21 is integrated with the busbar module 120 of the first stack 101. Integrating the units 10 and 20 with the busbar modules 120 can achieve a shorter height and a lighter weight of the battery pack 100 and achieve a reduction in the number of parts, for example.

The number of stacks in the battery pack 100 is not limited to five. The stacks 101, 102, 103, 104, and 105 may include any number of battery cells 110. The stacks 101, 102, 103, 104, and 105 may be connected in parallel in the battery pack 100. The battery cells 110 in the stacks 101, 102, 103, 104, and 105 may be connected in parallel. The first cable 35 and the second cable 36 may be configured by, for example, a coated wire instead of a flat cable.

First Modification of Embodiment

Figure 5:
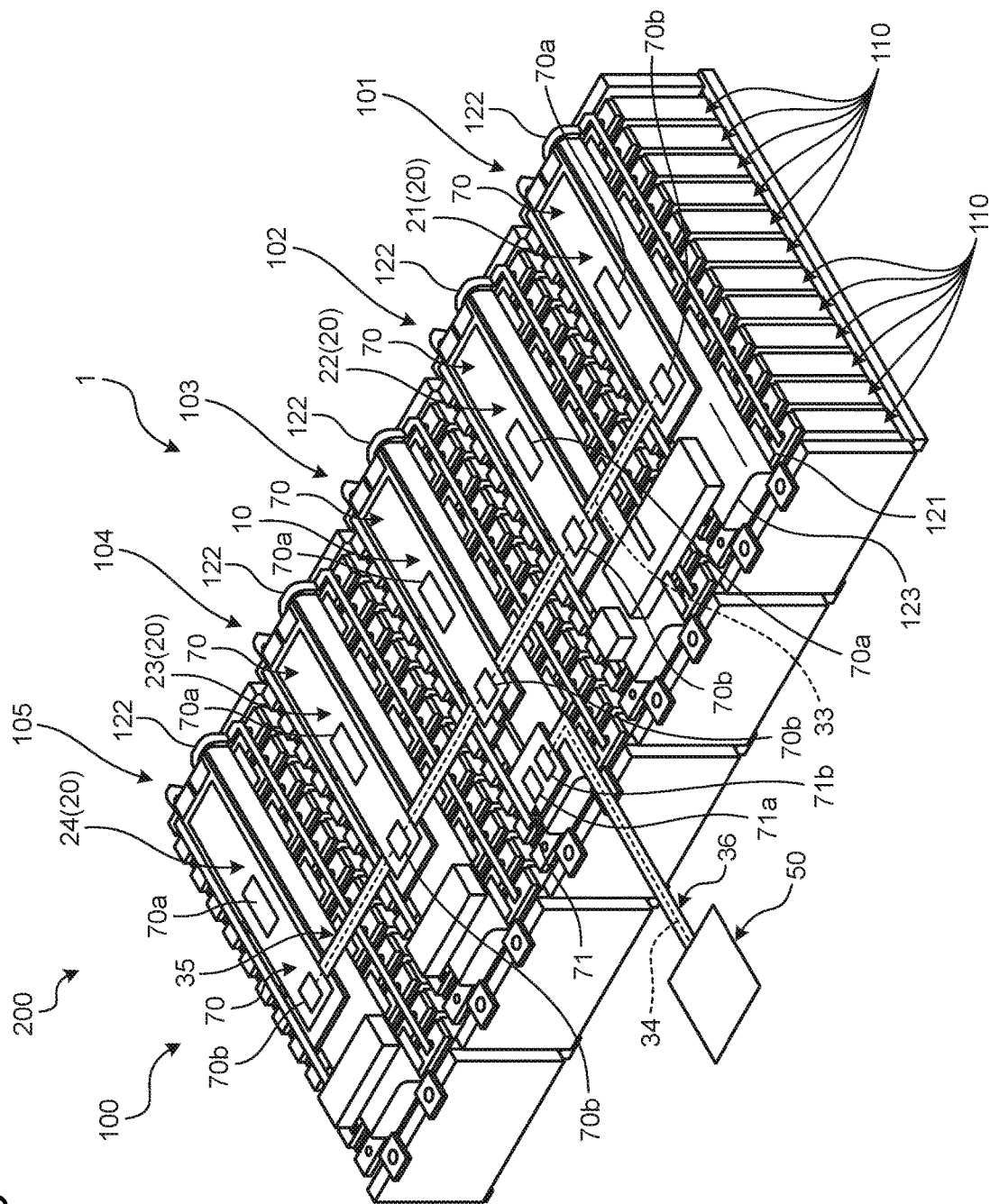
FIG. 5 is a perspective view illustrating a schematic configuration of a battery state detector according to a first modification of the embodiment.
Figure 6:
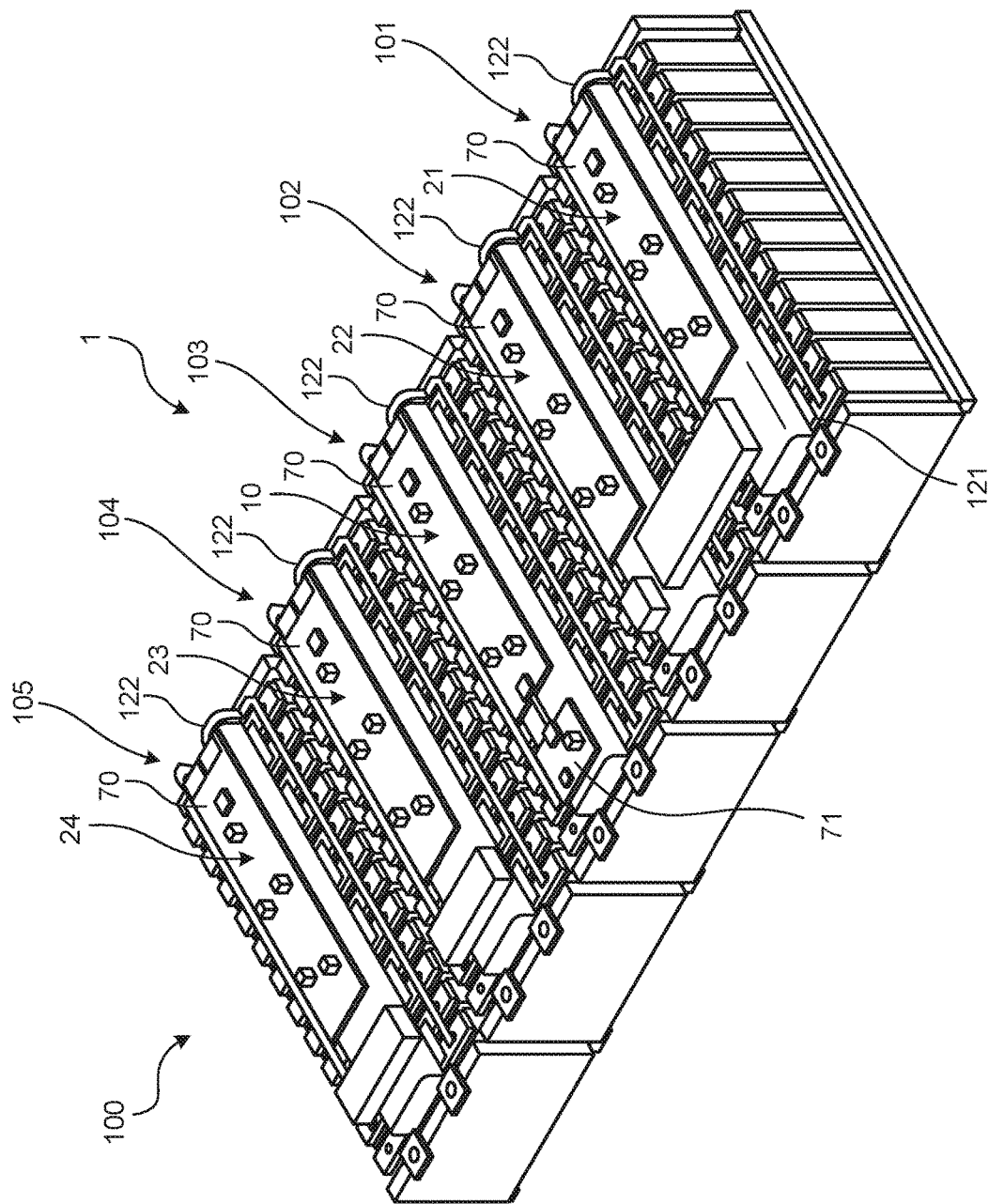
FIG. 6 is a perspective view illustrating an example of a specific configuration of the battery state detector according to the first modification of the embodiment.

A first modification of the embodiment is described. FIG. 5 is a perspective view illustrating a schematic configuration of a battery state detector according to the first modification of the embodiment, and FIG. 6 is a perspective view illustrating an example of a specific configuration of the battery state detector according to the first modification of the embodiment. The battery state detector 1 according to the first modification differs from the battery state detector 1 according to the embodiment above in that, for example, the main unit 10 is configured by a first substrate 70 and a second substrate 71. The first substrate 70 is also used as substrates configuring the subunits 20. Functions such as a management function of the main unit 10 are installed in the second substrate 71. The substrates 70 and 71 according to the first modification are, for example, plate-like rigid substrates such as a printed circuit board (PCB).

As illustrated in FIG. 5, the main unit 10 is disposed in the third stack 103 and detects the state of the third stack 103 in the same manner as in the embodiment above. The subunits 21, 22, 23, and 24 detect the states of the stacks 101, 102, 104, and 105, respectively. The main unit 10 and the subunits 20 according to the first modification are fixed on top faces of covers 123. The covers 123 are insulating members made of a synthetic resin, for example. Each cover 123 is fixed on the top face of the corresponding stack 101, 102, 103, 104, or 105 such that the cover 123 covers the busbars 121.

As illustrated in FIG. 6, the subunits 21, 22, 23, and 24 are configured by first substrates 70. Each first substrate 70 is connected to the busbars 121 via the voltage detection lines 122. The first substrates 70 each include a calculator 70a and a first communication interface 70b (see FIG. 5). The calculator 70a detects voltages of the battery cells 110. The calculator 70a may be configured to acquire temperatures of the battery cells 110 from the thermistor 30 in the same manner as in the embodiment above.

The main unit 10 includes the first substrate 70 and the second substrate 71. The first substrate 70 is communicably connected to the second substrate 71. The first substrates 70 of the subunits 20 and the first substrate 70 of the main unit 10 are connected via the first cable 35. It is preferred that the first cable 35 is a flat cable such as an FPC, an FFC, or a printed circuit body. The first communication interfaces 70b are communicably connected via the first communication line 33 in the first cable 35.

The second substrate 71 includes a calculator 71a and a second communication interface 71b. The second substrate 71 and the battery ECU 50 are connected via the second cable 36. The second cable 36 may be a flat cable such as an FPC, an FFC, or a printed circuit body. The second communication interface 71b is communicably connected to the battery ECU 50 via the second communication line 34 in the second cable 36. In the same manner as in the battery state detector 1 according to the embodiment above, the first communication line 33 that connects the main unit 10 with the subunits 20 is separate from the second communication line 34 that connects the main unit 10 with the battery ECU 50. The calculator 71a acquires cell voltages and battery temperatures detected by the calculators 70a of the subunits 20 and the calculator 70a of the main unit 10 by communication. The calculator 71a transmits management information based on the acquired detection results to the battery ECU 50.

Second Modification of Embodiment

The voltage detection lines 122 may be configured by an FFC or coated wires. The stacks 101, 102, 103, 104, and 105 may be stacked in tiers in the vertical direction as well as arranged in rows in the horizontal direction.

The embodiment and modifications above can be implemented by combining, as appropriate, the contents disclosed in the embodiment and modifications above.

The battery state detector according to the embodiment includes a main unit configured to detect a state of one battery assembly in a battery pack storing therein a plurality of battery assemblies each including a plurality of battery cells arranged in rows, a subunit configured to detect a state of a battery assembly in the battery pack other than the battery assembly that is a detection target of the main unit, and a first communication line that connects the main unit with the subunit. The main unit is connected to a controller that controls the battery pack via a second communication line that is separate from the first communication line. The battery state detector according to the embodiment can achieve a simpler configuration of communication wiring by separating the first communication line that connects the main unit with the subunit from the second communication line that connects the main unit with the controller. The separate configuration of the first communication line from the second communication line can reduce the communication load of the controller.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A battery state detector comprising:
    a main unit configured to detect a state of one battery assembly in a battery pack storing therein a plurality of battery assemblies each including a plurality of battery cells arranged in rows, and the main unit is provided to the one battery assembly;
    a subunit configured to detect a state of a battery assembly in the battery pack other than the one battery assembly that is a detection target of the main unit, and the subunit is provided to the battery assembly that is a detection target;
    a second subunit configured to detect a state of a second battery assembly in the battery pack, and the second subunit is provided to the second battery assembly; and
    a first communication line that connects the main unit with the subunit,
    wherein the main unit is connected to a controller configured to control the battery pack via a second communication line that is separate from the first communication line,
    wherein the main unit is arranged between the subunit and the second subunit,
    wherein the battery assembly and the second battery assembly are adjacent battery assemblies adjacent to the one battery assembly, and
    wherein the one battery assembly has a rectangular parallelepiped shape and is disposed in the battery pack so that longitudinal side surfaces of the adjacent batter assemblies face longitudinal side surfaces of the one battery assembly.

2. The battery state detector according to claim 1, wherein
    the main unit receives a detection result of the subunit from the subunit via the first communication line, and
    the main unit transmits management information based on the detection result of the subunit and a detection result of the main unit to the controller via the second communication line.

3. The battery state detector according to claim 1, wherein
    the main unit is integrated with a busbar module that electrically connects the battery cells in the one battery assembly, a state of the one battery assembly being detected by the main unit, and
    the subunit is integrated with a busbar module that electrically connects the battery cells in the battery assembly, a state of the battery assembly being detected by the subunit.

4. The battery state detector according to claim 2, wherein
    the main unit is integrated with a busbar module that electrically connects the battery cells in the one battery assembly, a state of the one battery assembly being detected by the main unit, and
    the subunit is integrated with a busbar module that electrically connects the battery cells in the battery assembly, a state of the battery assembly being detected by the subunit.

5. The battery state detector according to claim 1, wherein the main unit is further configured to determine whether each of the subunit and second subunit is in a normal state before reporting any of the state, of the battery assembly in the battery pack other than the one battery assembly that is the detection target of the main unit, and the state, of the second battery assembly, to the controller.

* * * * *